United States Patent
Dallesasse et al.

(10) Patent No.: US 8,559,470 B2
(45) Date of Patent: Oct. 15, 2013

(54) METHOD AND SYSTEM FOR HYBRID INTEGRATION OF A TUNABLE LASER AND A PHASE MODULATOR

(75) Inventors: John Dallesasse, Geneva, IL (US); Stephen B. Krasulick, Albuquerque, NM (US); William Kozlovsky, Sunnyvale, CA (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 13/040,179

(22) Filed: Mar. 3, 2011

(65) Prior Publication Data

US 2012/0057610 A1    Mar. 8, 2012

Related U.S. Application Data

(63) Continuation-in-part of application No. 12/903,025, filed on Oct. 12, 2010.

(60) Provisional application No. 61/251,143, filed on Oct. 13, 2009.

(51) Int. Cl.
*H01S 3/10*    (2006.01)

(52) U.S. Cl.
USPC .......................................... 372/20; 372/50.11

(58) Field of Classification Search
USPC ................................................. 372/20, 50.11
See application file for complete search history.

(56) References Cited

U.S. PATENT DOCUMENTS

| | | |
|---|---|---|
| 4,293,826 A | 10/1981 | Scifres et al. |
| 5,190,883 A | 3/1993 | Menigaux et al. |
| 5,319,667 A | 6/1994 | Dutting et al. |
| 5,333,219 A | 7/1994 | Kuznetsov |
| 5,858,814 A | 1/1999 | Goossen et al. |
| 5,981,400 A | 11/1999 | Lo |
| 5,987,050 A | 11/1999 | Doerr et al. |
| 6,101,210 A * | 8/2000 | Bestwick et al. ............... 372/96 |
| 6,192,058 B1 | 2/2001 | Abeles |

(Continued)

FOREIGN PATENT DOCUMENTS

| | | |
|---|---|---|
| JP | 2013-507792 A | 4/2013 |
| TW | 201140975 | 11/2011 |
| WO | WO 2011/046898 A1 | 4/2011 |

OTHER PUBLICATIONS

Final Office Action for U.S. Appl. No. 12/903,025 mailed on May 16, 2012, 14 pages.
Final Office Action for U.S. Appl. No. 13/040,154 mailed on May 16, 2012, 14 pages.
Restriction Requirement for U.S. Appl. No. 12/902,621 mailed on May 17, 2012, 8 pages.
Non-Final Office Action for U.S. Appl. No. 13/040,181 mailed on May 22, 2012, 12 pages.

(Continued)

*Primary Examiner* — Tod T Van Roy
(74) *Attorney, Agent, or Firm* — Kilpatrick Townsend & Stockton LLP

(57) ABSTRACT

A tunable laser includes a substrate comprising a silicon material and a gain medium coupled to the substrate. The gain medium includes a compound semiconductor material. The tunable laser also includes an optical modulator optically coupled to the gain medium, a phase modulator optically coupled to the optical modulator, and a waveguide disposed in the substrate and optically coupled to the gain medium. The tunable laser further includes a first wavelength selective element characterized by a first reflectance spectrum and disposed in the substrate, a second wavelength selective element characterized by a second reflectance spectrum and disposed in the substrate, an optical coupler disposed in the substrate and joining the first wavelength selective element, the second wavelength selective element, and the waveguide, and an output mirror.

23 Claims, 12 Drawing Sheets

(56) References Cited

U.S. PATENT DOCUMENTS

| | | | |
|---|---|---|---|
| 6,714,566 | B1 | 3/2004 | Coldren et al. |
| 6,728,279 | B1 | 4/2004 | Sarlet et al. |
| 7,058,096 | B2 | 6/2006 | Sarlet et al. |
| 7,257,283 | B1 | 8/2007 | Liu et al. |
| 7,633,988 | B2 * | 12/2009 | Fish et al. .................. 372/50.22 |
| 7,972,875 | B2 | 7/2011 | Rogers et al. |
| 8,106,379 | B2 | 1/2012 | Bowers |
| 8,222,084 | B2 | 7/2012 | Dallesasse et al. |
| 8,290,014 | B2 | 10/2012 | Junesand et al. |
| 8,368,995 | B2 | 2/2013 | Dallesasse et al. |
| 2002/0197013 | A1 | 12/2002 | Liu et al. |
| 2003/0042494 | A1 | 3/2003 | Worley |
| 2003/0128724 | A1 | 7/2003 | Morthier |
| 2004/0037342 | A1 | 2/2004 | Blauvelt et al. |
| 2004/0228384 | A1 | 11/2004 | Oh et al. |
| 2004/0259279 | A1 | 12/2004 | Erchak et al. |
| 2005/0211993 | A1 | 9/2005 | Sano et al. |
| 2005/0213618 | A1 | 9/2005 | Sochava et al. |
| 2005/0226284 | A1 | 10/2005 | Tanaka et al. |
| 2006/0002443 | A1 * | 1/2006 | Farber et al. .................. 372/50.1 |
| 2007/0002924 | A1 | 1/2007 | Hutchinson et al. |
| 2007/0280326 | A1 | 12/2007 | Piede et al. |
| 2009/0016399 | A1 | 1/2009 | Bowers |
| 2009/0135861 | A1 | 5/2009 | Webster et al. |
| 2009/0267173 | A1 | 10/2009 | Takahashi et al. |
| 2009/0278233 | A1 | 11/2009 | Pinnington et al. |
| 2009/0294803 | A1 | 12/2009 | Nuzzo et al. |
| 2010/0111128 | A1 | 5/2010 | Qin et al. |
| 2011/0085572 | A1 | 4/2011 | Dallesasse et al. |
| 2011/0085577 | A1 | 4/2011 | Krasulick et al. |
| 2011/0089524 | A1 | 4/2011 | Nonagaki |
| 2011/0165707 | A1 | 7/2011 | Lott et al. |
| 2011/0211604 | A1 | 9/2011 | Roscher |
| 2011/0267676 | A1 | 11/2011 | Dallesasse et al. |
| 2012/0001166 | A1 | 1/2012 | Doany et al. |
| 2012/0002694 | A1 | 1/2012 | Bowers et al. |
| 2012/0057079 | A1 | 3/2012 | Dallesasse et al. |
| 2012/0057609 | A1 | 3/2012 | Dallesasse et al. |
| 2012/0057816 | A1 | 3/2012 | Krasulick et al. |
| 2012/0120978 | A1 | 5/2012 | Budd et al. |
| 2012/0189317 | A1 | 7/2012 | Heck et al. |
| 2012/0264256 | A1 | 10/2012 | Dallesasse et al. |
| 2012/0320939 | A1 | 12/2012 | Baets et al. |
| 2013/0037905 | A1 | 2/2013 | Shubin et al. |

OTHER PUBLICATIONS

Coldren et al., "Tunable Semiconductor Lasers: A Tutorial," Journal of Lightwave Technology, Jan. 2004; 22(1):193-202.

Coldren, "Monolithic Tunable Diode Lasers," IEEE Journal on Selected Topics in Quantum Electronics, Nov./Dec. 2000; 6(6):988-999.

Hildebrand et al., "The Y-Laser: A Multifunctional Device for Optical Communication Systems and Switching Networks," Journal of Lightwave Technology, Dec. 1993; 11(12):2066-2075.

Isaksson et al., "10 Gb/s Direct Modulation of 40 nm Tunable Modulated-Grating Y-branch Laser," 10 Gb/s Direct Modulation of 40 nm Tunable Modulated-Grating Y-Branch Laser, in Optical Fiber Communication Conference and Exposition and the National Fiber Optic Engineers Conference, Technical Digest (CD) (Optical Society of America, 2005), paper OTuE2.

Kuznetsov et al., "Asymmetric Y-Branch Tunable Semiconductor Laser with 1.0 THz Tuning Range," IEEE Photonics Technology Letters, Oct. 1992; 4(10):1093-1095.

Laroy et al., "Characteristics of the New Modulated Grating Y laser (MG-Y) for Future WDM Networks," Proceedings Symposium IEEE/LEOS Benelux Chapter, 2003, Enschede, pp. 55-58, retrieved from the Internet: <http://leosbenelux.org/symp03/s03p055.pdf>.

Laroy, "New Concepts of Wavelength Tunable Laser Diodes for Future Telecom Networks," [dissertation] Universiteit Gent, 2006 [in Dutch and English], 162 pages.

Laroy, "New Widely Tunable Laser Concepts for Future Telecommunication Networks," FTW-symposium, Belgium, 2002;retrieved from the Internet: <http://photonics.intec.ugent.be/download/pub_1625.pdf>, 2 pages total.

Magno et al., "Multiphysics Investigation of Thermo-optic Effect in Silicon-on-Insulator Waveguide Arrays," Excerpt from the Proceedings of the COMSOL Users Conference 2006, retrieved from the Internet: <http://cds.comsol.com/access/dl/papers/1628/Magno.pdf>, 6 pages total.

Morthier et al., "New Widely Tunable Edge-Emitting Laser Diodes at 1.55 μm Developed in the European IST-project Newton," Semiconductor and Organic Optoelectronic Materials and Devices. Edited by Zah, Chung-En; Luo, Yi; Tsuji, Shinji. Proceedings of the SPIE, 2005; 5624:1-8; retrieved from the Internet: <http://photonics.intec.ugent.be/download/pub_1800.pdf>.

Morthier, "Advanced Widely Tunable Edge-Emitting Laser Diodes and Their Application in Optical Communications," [presentation], Ghent University—IMEC, 2000, 23 pages total. Can be retrieved from the Internet: <broadband02.ici.ro/program/morthier_3a.ppt>.

Morthier, "New Widely Tunable Lasers for Optical Networks," Newton Project Number: IST-2000-28244, Dec. 2001; retrieved from the Internet: <http://www.ist-optimist.unibo.it/pdf/network/projects_public/NEWTON/Deliverables/D01.pdf>, 5 pages total.

Passaro et al., "Investigation of Thermo-Optic Effect and Multireflector Tunable Filter/Multiplexer in SOI Waveguides," Optics Express, May 2, 2005; 13(9):3429-3437.

Wesström et al., "Design of a Widely Tunable Modulated Grating Y-branch Laser Using the Additive Vernier Effect for Improved Super-Mode Selection," IEEE 18th International Semiconductor Laser Conference, 2002, 99-100; retrieved from the Internet: <http://photonics.intec.ugent.be/download/pub_1603.pdf>.

Wesström et al., "State-of-the-Art Performance of Widely Tunable Modulated Grating Y-Branch Lasers," Optical Fiber Communication Conference, Technical Digest (CD) (Optical Society of America, 2004), paper TuE2.

International Search Report and Written Opinion of PCT Application No. PCT/US2010/052249, mailed Feb. 15, 2011, 13 pages.

Non-Final Office Action for U.S. Appl. No. 12/903,025 mailed on Dec. 29, 2011, 12 pages.

Non-Final Office Action for U.S. Appl. No. 13/040,154 mailed on Jan. 31, 2012, 13 pages.

Non-Final Office Action for U.S. Appl. No. 12/902,621 mailed on Sep. 18, 2012, 14 pages.

Notice of Allowance for U.S. Appl. No. 13/076,205 mailed on Sep. 19, 2012, 9 pages.

Non-Final Office Action for U.S. Appl. No. 13/527,394 mailed on Aug. 31, 2012, 6 pages.

Notice of Allowance for U.S. Appl. No. 13/112,142 mailed on Mar. 20, 2012, 8 pages.

Non-Final Office Action for U.S. Appl. No. 12/903,025 mailed on Dec. 5, 2012, 13 pages.

Non-Final Office Action for U.S. Appl. No. 13/040,154 mailed on Dec. 4, 2012, 15 pages.

Final Office Action for U.S. Appl. No. 13/040,181 mailed on Dec. 5, 2012, 12 pages.

Restriction Requirement for U.S. Appl. No. 13/040,184 mailed on Dec. 21, 2012, 8 pages.

Non-Final Office Action for U.S. Appl. No. 12/902,621 mailed on Apr. 23, 2013, 13 pages.

Non-Final Office Action for U.S. Appl. No. 13/040,184 mailed on Apr. 23, 2013, 16 pages.

Final Office Action for U.S. Appl. No. 12/903,025 mailed on May 29, 2013, 10 pages.

Final Office Action for U.S. Appl. No. 13/040,154 mailed on Jun. 17, 2013, 11 pages.

Notice of Allowance for U.S. Appl. No. 13/040,154 mailed on Jul. 26, 2013, 4 pages.

* cited by examiner

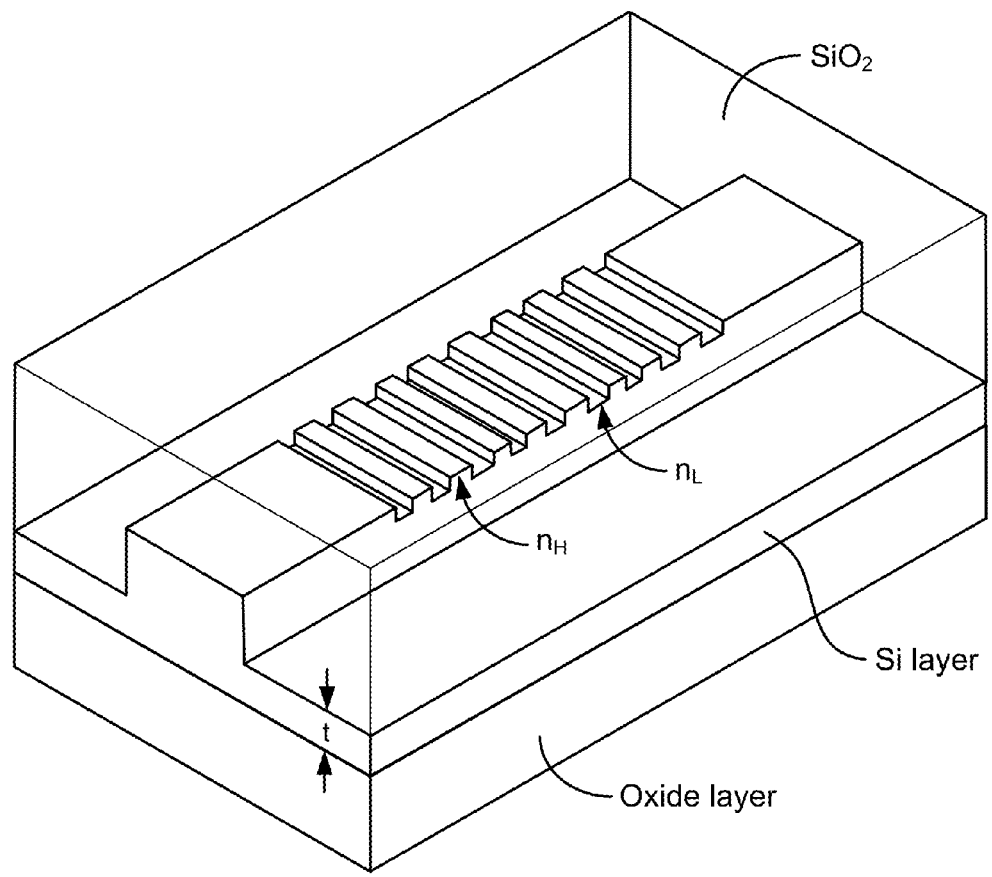
FIG. 3A
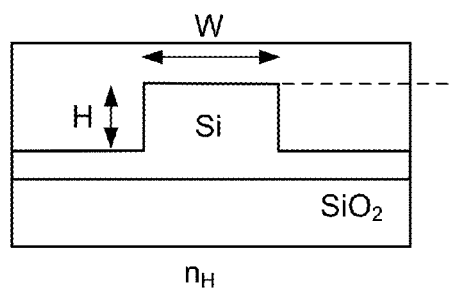
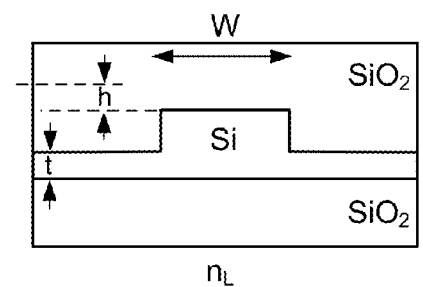
FIG. 3B          FIG. 3C

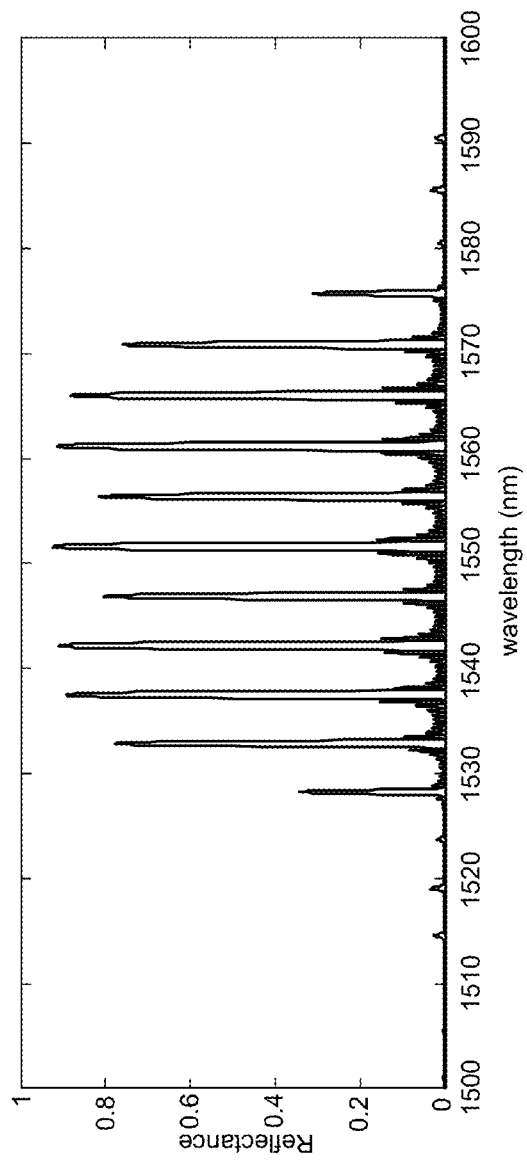
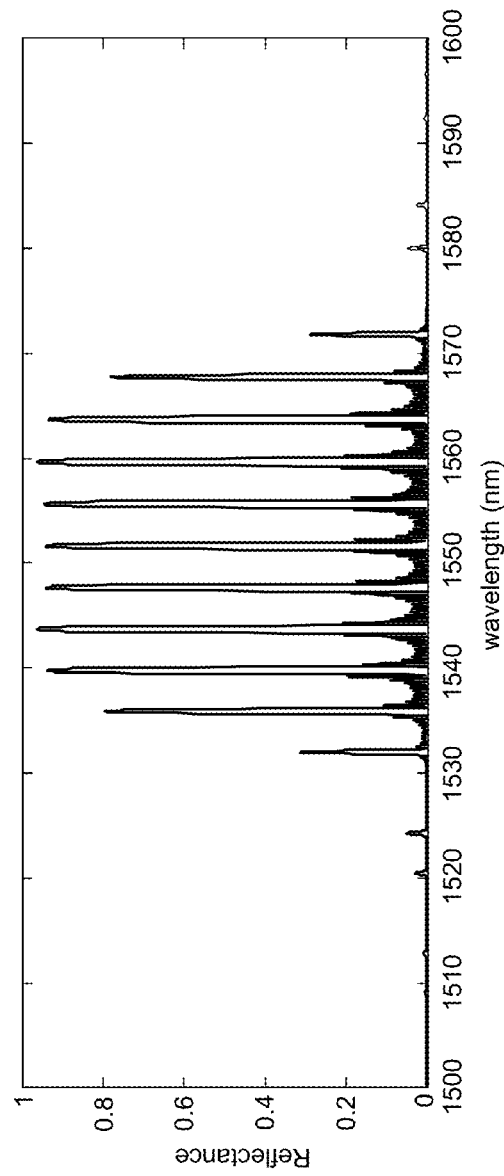
FIG. 4A
FIG. 4B

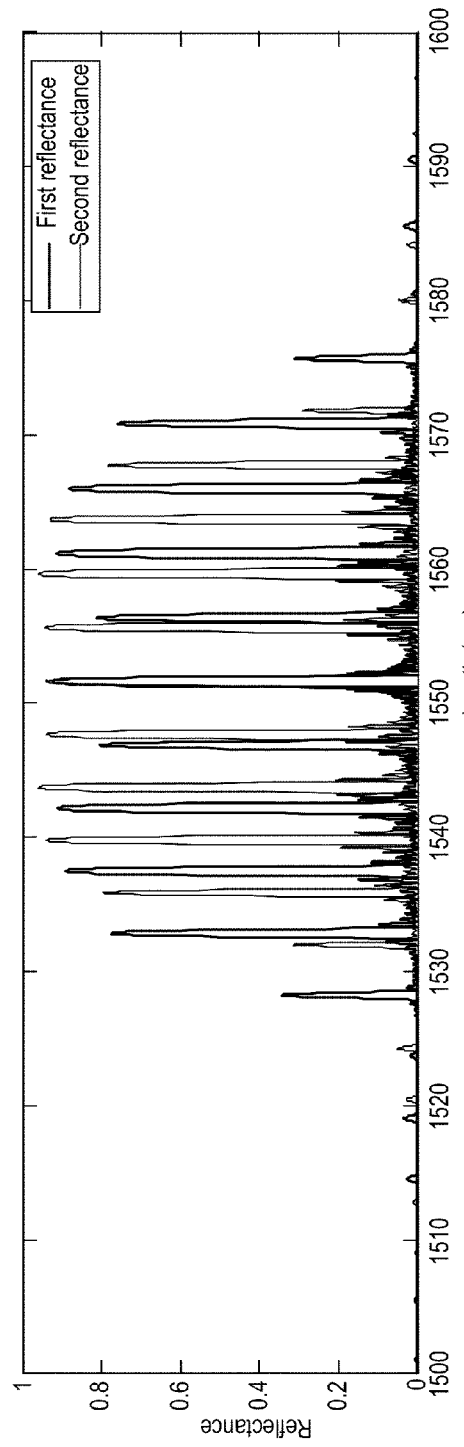
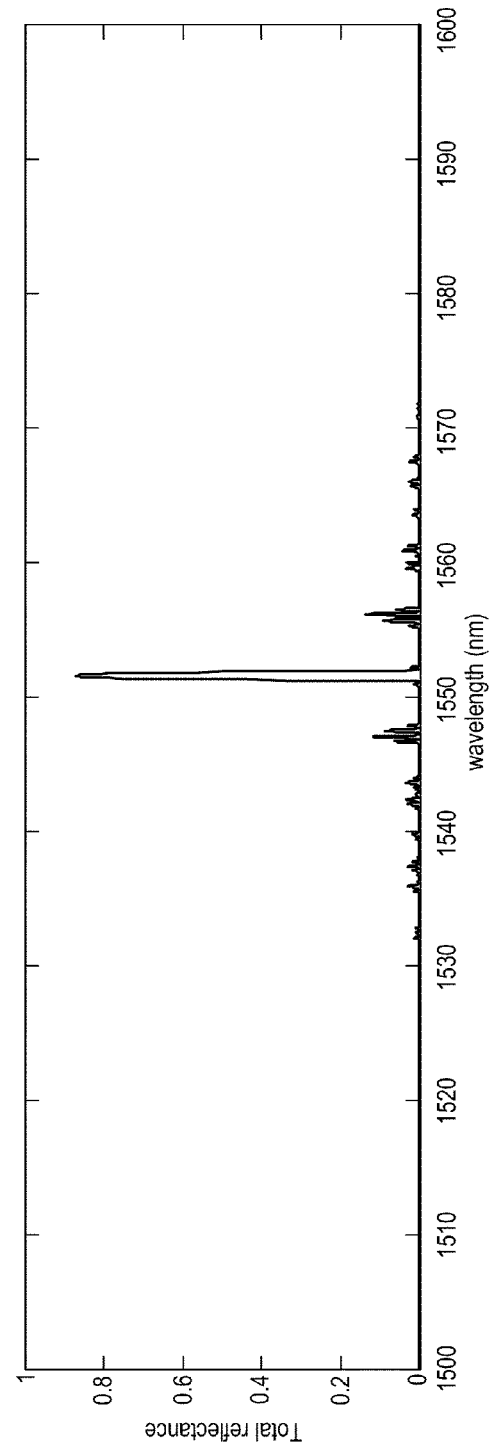
FIG. 4C
FIG. 4D

METHOD AND SYSTEM FOR HYBRID INTEGRATION OF A TUNABLE LASER AND A PHASE MODULATOR

CROSS-REFERENCES TO RELATED APPLICATIONS

This present application is a continuation-in-part of U.S. patent application Ser. No. 12/903,025, filed on Oct. 12, 2010, which claims priority to U.S. Provisional Patent Application No. 61/251,143, filed on Oct. 13, 2009, the disclosures of which are hereby incorporated by reference in their entirety for all purposes. U.S. patent application Ser. No. 12/903,025 was filed concurrently with 12/902,621, the disclosure of which is hereby incorporated by reference in its entirety for all purposes.

BACKGROUND OF THE INVENTION

Advanced electronic functions such as photonic device bias control, modulation, amplification, data serialization and de-serialization, framing, routing, and other functions are typically deployed on silicon integrated circuits. A key reason for this is the presence of a global infrastructure for the design and fabrication of silicon integrate circuits that enables the production of devices having very advanced functions and performance at market-enabling costs. Silicon has not been useful for light emission or optical amplification due to its indirect energy bandgap. This deficiency has prevented the fabrication of monolithically integrated opto-electronic integrated circuits on silicon.

Compound semiconductors such as indium phosphide, gallium arsenide, and related ternary and quaternary materials have been extremely important for optical communications, and in particular light emitting devices and photodiodes, because of their direct energy bandgap. At the same time, integration of advanced electrical functions on these materials has been limited to niche, high-performance applications due to the much higher cost of fabricating devices and circuits in these materials.

Thus, there is a need in the art for improved methods and systems related to hybrid integration of silicon and compound semiconductor devices.

SUMMARY OF THE INVENTION

Embodiments of the present invention relate to hybrid-integrated silicon photonics. More particularly, embodiments of the present invention relate to an apparatus and method of hybrid integration of compound semiconductor chips with tuning elements monolithically integrated onto a silicon base and the like.

According to an embodiment of the present invention, techniques related to photonic integration are provided. Merely by way of example, embodiments of the present invention have been applied to methods and systems for fabricating and operating a tunable laser utilizing a hybrid design. More particularly, an embodiment of the present invention includes a hybrid system including a semiconductor laser device fabricated in a first material system and a wavelength tuning device fabricated in a second material system. In some embodiments, the tunable laser is fabricated using bonding methodology described in related U.S. patent application Ser. No. 12/902,621. However, the scope of the present invention is broader than this application and includes other photonic systems.

According to an embodiment of the present invention, a tunable pulsed laser is provided. The tunable pulsed laser includes a substrate comprising a silicon material and a gain medium coupled to the substrate. The gain medium includes a compound semiconductor material. The tunable pulsed laser also includes an optical modulator optically coupled to the gain medium, a phase modulator optically coupled to the optical modulator, and a waveguide disposed in the substrate and optically coupled to the gain medium. The tunable pulsed laser further includes a first wavelength selective element characterized by a first reflectance spectrum and disposed in the substrate, a second wavelength selective element characterized by a second reflectance spectrum and disposed in the substrate, an optical coupler disposed in the substrate and joining the first wavelength selective element, the second wavelength selective element, and the waveguide, and an output mirror.

According to another embodiment of the present invention, a method of operating a tunable pulsed laser is provided. The method includes tuning a first modulated grating reflector and tuning a second modulated grating reflector. The first modulated grating reflector is characterized by a first reflectance spectra including a first plurality of reflectance peaks and the second modulated grating reflector is characterized by a second reflectance spectra including a second plurality of reflectance peaks. The method also includes generating optical emission from a gain medium comprising a compound semiconductor material, waveguiding the optical emission to pass through an optical coupler, reflecting a portion of the optical emission having a spectral bandwidth defined by an overlap of one of the first plurality of reflectance peaks and one of the second plurality of reflectance peaks, and amplifying the portion of the optical emission in the gain medium. The method further includes transmitting a portion of the amplified optical emission through an output mirror, optically modulating the transmitted optical emission to form a pulsed optical output, and phase modulating the pulsed optical output.

According to yet another embodiment of the present invention, both amplitude and phase of the optical emission are modulated, with information contained on both the real (amplitude) and imaginary (phase) portions of the optical signal. The method additionally may include transmitting the light through an optical device for SBS suppression. The method further includes the driving and monitoring of all optical devices on the chip with circuit elements on the chip.

Numerous benefits are achieved by way of the present invention over conventional techniques. For example, embodiments of the present invention provide methods and systems suitable for reducing the size and power consumption of optical communications systems, relaxing the requirements for stringent temperature control of the devices, and improving the laser linewidth through minimizing refractive index fluctuations in the device. These and other embodiments of the invention along with many of its advantages and features are described in more detail in conjunction with the text below and attached figures.

BRIEF DESCRIPTION OF THE DRAWINGS

FIG. 3A is a simplified perspective view of a waveguide including grating elements according to an embodiment of the present invention;

FIG. 3B is a simplified cross-sectional view at a high index portion of the waveguide illustrated in FIG. 3A according to an embodiment of the present invention;

FIG. 3C is a simplified cross-sectional view at a low index portion of the waveguide illustrated in FIG. 3A according to an embodiment of the present invention;

FIG. 4A illustrates a reflectance spectrum for a first modulated grating reflector according to an embodiment of the present invention;

FIG. 4B illustrates a reflectance spectrum for a second modulated grating reflector according to an embodiment of the present invention;

FIG. 4C illustrates an overlay of the reflectance spectra shown in FIG. 4A and FIG. 4B;

FIG. 4D illustrates constructive interference between the reflectance spectra shown in FIG. 4A and FIG. 4B;

DETAILED DESCRIPTION OF THE INVENTION

Figure 1A:
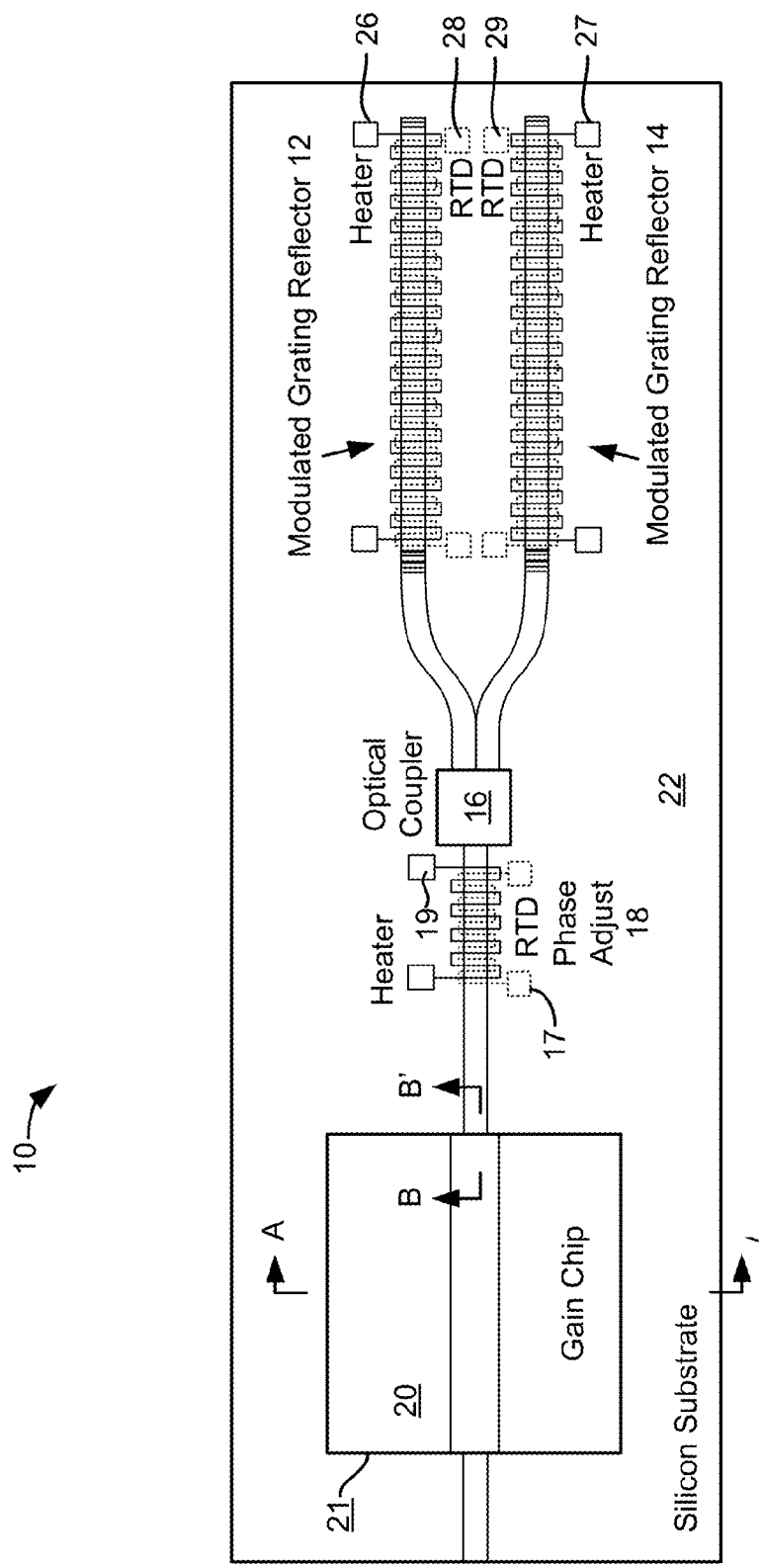
FIG. 1A is a simplified plan view illustrating a hybrid integrated tunable laser according to an embodiment of the present invention.

Hybrid integration on silicon is preferable for the commercial deployment of optoelectronic integrated circuits. Silicon is a preferable material for electronic integration. Silicon technology has advanced such that extremely complex electronic functions can be realized very inexpensively. Silicon is also a good material for constructing low loss optical waveguides. However, monolithic integration of light generating or detecting functions has been prevented in silicon because it is an indirect bandgap material. Conversely, compound semiconductor materials, including III-V materials such as indium phosphide are well suited for light generation and detection because of their physical properties such as being direct bandgap materials. These materials are complex material systems with small substrates and relatively (compared to silicon) low yields. As such, constructing devices with a high level of functionality is currently cost prohibitive.

Embodiments of the present invention relate to an apparatus and method for hybrid integration of compound semiconductor devices with tuning elements monolithically integrated onto a silicon base or similar material. Throughout this specification, the term "composite integration" can be used interchangeably with the term "hybrid integration." Preferably, hybrid or composite integration is the method to overcome the specific deficiencies of silicon and compound semiconductors while capitalizing on their respective strengths. Embodiments of the present invention preferably utilize the complex electronic functionality in available using silicon devices to minimize cost, and the optical functions (e.g., light generation and detection) available using III-V materials to form hybrid integrated systems. Some embodiments of the present invention remove functionality from the III-V material system and transfer such functionality to the silicon system to improve system performance.

Embodiments of the present invention utilize photonic apparatus fabricated using compound semiconductor material systems that are mounted onto silicon integrated circuit platforms and the like. Embodiments of the present invention achieve photonic integration by utilizing a plurality of techniques and apparatus that do not historically rely on a direct energy bandgap, including, but not limited to, waveguides, optical multiplexers, optical demultiplexers, optical modulators, and the like, that can be fabricated using silicon and similar materials. Embodiments of the present invention optionally include, but are not limited to, methods of modifying the refractive index of silicon via current injection or local heating.

Embodiments of the present invention include, but are not limited to, optionally utilizing the laser devices that serve as the initial source of optical energy. In today's dense wavelength division multiplexing ("DWDM") systems, the laser sources are typically fixed-wavelength distributed feedback lasers or tunable lasers. Tunable lasers preferably provide additional flexibility to the optical communications network operators. Some DWDM systems can use lasers with up to 80 different wavelengths. A single tunable laser is capable of tuning to any of those wavelengths. One tunable laser can be inventoried and used to replace any of 80 fixed wavelength lasers, thereby reducing the required inventory levels and the associated costs.

The term "silicon" as used throughout this application includes but is not limited to tetravalent nonmetallic elements and the like. The term "laser" as used throughout the specification includes but is not limited to an acronym for light amplification by stimulated emission of radiation; and/or an optical device that produces an intense monochromatic beam of coherent light. The term "SOI" and/or "Silicon on Insulator" stands for, a type of substrate material as used throughout this specification includes but is not limited to grating and tuning testing. The term "DWDM" and/or "Dense Wavelength Division Multiplexing" as used throughout this application includes but is not limited to a technique utilized by the optical communications industry to maximize system bandwidth while minimizing capital expenditures and operational expenditures. These costs are minimized through the use of DWDM techniques because the system operators can increase their system bandwidth simply by adding another optical wavelength as opposed to needing to deploy additional optical fibers which usually requires significant expense. The term "bandgap" as used throughout this application includes but is not limited to an energy range in a solid where no electron states exist; and/or the energy difference between the top of the valence band and the bottom of the conduction band; and/or the amount of energy required to free an outer shell electron from its orbit about the nucleus to a free state; and/or any combination thereof. The term "photonic integration" as used throughout this application includes but is not limited to the meaning to make into a whole or make part of a whole multiple functions and reduce packaging size by an order of magnitude, for example, while matching the performance of a subsystem built with discrete components. The term "gain media" and interchangeably "gain chip" as used throughout this application includes but is not limited to the source of optical gain within a laser. The gain generally results from the stimulated emission of electronic or molecular transitions to a lower energy state from a higher energy state. The term "InP" or "Indium Phosphide", as used throughout this application is used interchangeably with the phrase "III-V compound semiconductor".

FIG. 1A is a simplified plan view illustrating a hybrid integrated tunable laser according to an embodiment of the present invention. As illustrated in FIG. 1A, laser 10 is a hybrid integrated structure including both active and passive elements disposed on or fabricated in a silicon substrate 22. Although a silicon substrate 22 is illustrated, this is intended to include a variety of semiconductor devices fabricated using the silicon material system. Such devices include CMOS circuitry, current sources, laser drivers, thermal system controllers, passive optical elements, active optical elements, and the like.

Referring to FIG. 1A, a first modulated grating reflector 12 and a second modulated grating reflector 14 are fabricated on the silicon substrate 22. Modulated grating reflectors 12 and 14 are preferably modifiable to adjust the refractive index. The first modulated grating reflector 12 and the second modulated grating reflector 14 are examples of wavelength selective elements that are utilized according to embodiments of the present invention. The illustration of the use of modulated grating reflectors in FIG. 1A is not intended to limit the scope of the present invention but merely to provide examples of wavelength selective elements. Other wavelength selective elements can be utilized in embodiments of the present invention. As described more fully below, the wavelength selective elements can be sampled Bragg gratings or sampled distributed feedback reflectors that provide a comb of reflectance peaks having a variable comb spacing over a tunable wavelength range. Embodiments of the present invention are not limited to these implementations and photonic crystals, etalon structures, MEMS devices, ring resonators, arrayed-waveguide grating devices, Mach-Zehnder lattice filters, and the like can be employed as wavelength selective elements. A benefit provided by the wavelength selective elements discussed herein is a reflection spectra including a single or multiple peaks that can be shifted through the use of a controllable parameter such as current, voltage, temperature, mechanical force, or the like.

As an example, heaters integrated into the silicon substrate can be utilized to locally change the temperature of the region surrounding the modulated grating reflectors and thereby, the index of refraction. As described more fully below, the ability to control the local index of refraction provides the functionality of varying the reflectivity of the modulated grating reflectors and the output wavelength of the hybrid integrated device.

Laser 10 further includes, but is not limited to, multimode interference coupler 16 and one or multiple phase adjustment sections 18. The phase adjustment section 18 can also be referred to as a phase control region that provides for correction of phase misalignment between the output of the coupler section, which may be implemented through wavelength selective devices (e.g., the grating sections) and the gain media 20. In the illustrated embodiment, the phase adjustment section 18 is positioned between the multimode interference coupler 16 and the gain media 20, however, other embodiments locate this element in different locations providing the same or similar performance characteristics.

The coupler section, which may be implemented through the use of a multimode interference coupler, y-branch, or other method, splits and recombines light from two or more tuning sections. The multimode interference coupler, which is based upon the principle that coherent light launched from a waveguide (input waveguide) into a propagation section will self image at periodic intervals, can be used to efficiently achieve n×m splitting ratios. In this instance, the design is optimized for a 1×2 split but other splitting ratios may be employed in the case where there are either multiple gain chips or more than 2 tuning arms. An advantage provided by the illustrated device is that coherent light returning from the tuning arms, where the phase relationship of the light is fixed, can be coupled back into the launch waveguide with minimal excess loss. In order to ensure that the interference pattern of the returning light has maximum overlap with the input waveguide, a phase adjustment section may be implemented in one or more of the branch arms. In addition to phase adjustment in the branch arms, a phase adjustment section 18 is utilized in the waveguide section leading from the coupler 16 to the gain chip 20. This phase adjustment section, which can be implemented though a device such as a heater or current injection electrode, which changes the refractive index in the waveguide layer under the device, serves to provide an overlap between the cavity modes of the device and the grating mode selected by tuning section.

As illustrated in FIG. 1A, gain media 20 (also referred to as a gain chip) fabricated using a compound semiconductor material system is integrated with the silicon substrate 22 in a hybrid configuration. The compound semiconductor material, which is direct bandgap, provides optical gain for the laser device. The hybrid integration or attachment of the gain media (and/or other compound semiconductor elements) to the silicon substrate can be provided in one or several manners. In a particular embodiment, the hybrid integration is performed using the methods and systems described in U.S. Patent Application Publication No. US-2011-0085572-A1, published on Apr. 14, 2011. In addition to gain media, absorptive media fabricated using compound semiconductor materials can be integrated with the silicon substrate. Embodiments of the present invention integrate III-V devices and structures acting as gain and/or absorption regions with silicon photonics elements in which optical and/or electrical functionality is provided. The silicon photonic elements may include CMOS circuitry and the like. One of ordinary skill in the art would recognize many variations, modifications, and alternatives.

As discussed in more detail in relation to FIGS. 4-4D, modulated grating reflectors 12 and 14 provide feedback at one end of the laser 10. Feedback in the form of a front facet reflector is provided by a low reflectance coating (e.g., a dielectric coating with a reflectance of a few percent, for example, ~1-10%) applied to the gain media on surface 21. Alternatively, a distributed feedback (e.g., a grating) structure could be integrated into the silicon substrate to provide feedback for the laser cavity. In another embodiment, a low reflectance coating is applied to a surface of the silicon substrate. One of ordinary skill in the art would recognize many variations, modifications, and alternatives. As illustrated in FIG. 1A, optical functionality other than optical gain has been transferred from the III-V materials in which it is typically located and integrated into the silicon materials, thereby increasing device yield in comparison with designs that are fully integrated in III-V materials. In the illustrated embodiment, the tunable reflective sections (also referred to as wavelength selective devices) and other optical functions are performed in the silicon material.

FIG. 1A also illustrates heater element 26 and temperature sensor 28 associated with first modulated grating reflector 12 and heater element 27 and temperature sensor 29 associated with the second modulated grating reflector. In an embodiment, the heater element can be a thin film resistor formed through the vacuum deposition of a material such as W, NiCr, TaN, WSi, $RuO_2$, PbO, $Bi_2Ru_2O_7$, $Bi_2Ir_2O_7$, cobalt salicide, or the like.

In an embodiment, the temperature sensor can be a resistive thermal device (RTD), a thermocouple, a p-n junction, or the like. By flowing a current through the heaters, the temperature of the region surrounding the modulated grating reflectors can be modified in order to modify the index of refraction and the reflectance profile as a result. Phase adjustment section 18, which also may use the temperature dependence of the refractive index to control the effective optical length and thereby the phase of light, is also provided with a heater and a temperature sensor to provide similar functionality and wavelength tunability.

Some embodiments of the present invention utilize thermal tuning to achieve index of refraction changes in the silicon-based modulated grating reflectors. One of the benefits available using thermal tuning is a significant reduction in the short time scale variations in index of refraction that are produced using thermal tuning in comparison to these variations achieved using current tuning in the InP or GaAs material system. Such improvement in refractive index stability will result in a laser linewidth significantly narrower than can be achieved using other approaches. As will be evident to one of skill in the art, the stable tuning provided by embodiments of the present invention enables use of the lasers described herein in DWDM applications and other applications utilizing precisely tuned lasers. As an example, advanced modulation techniques such as DQPSK can benefit from use of the lasers described herein.

The phase adjustment section operates through the modification of the refractive index of the waveguide section contained therein. Through modification of the refractive index, the phase angle of the light exiting the phase adjustment device relative the input phase angle can be precisely controlled. This allows the alignment of laser cavity modes with grating modes. In the illustrated embodiment, the phase adjustment device 18 includes a heater 19 and a temperature sensor (e.g., an RTD) 17.

Figure 1B:
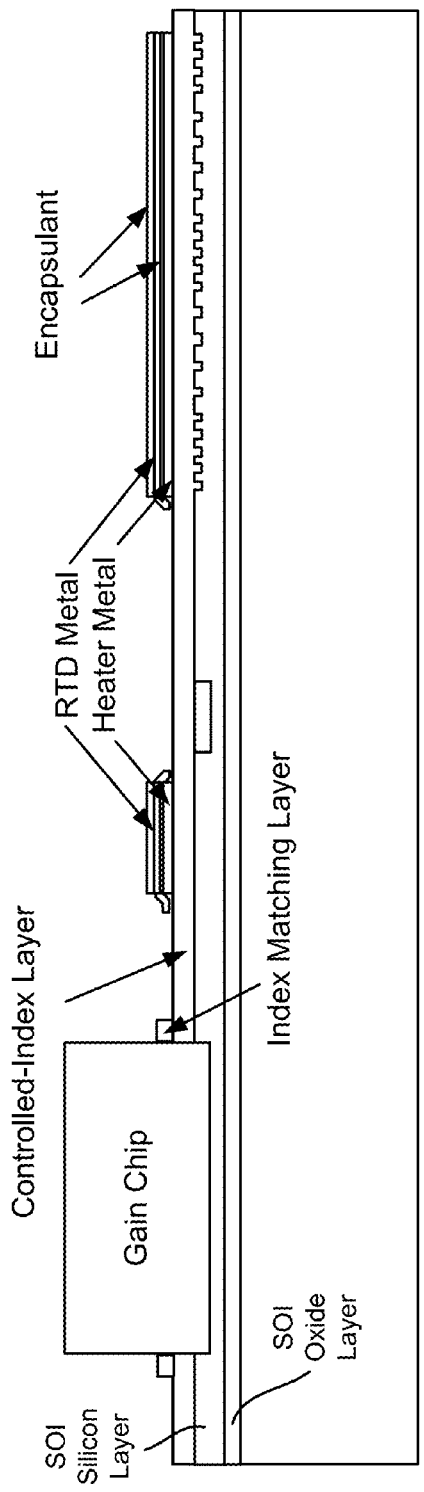
FIG. 1B is a simplified cross-sectional view illustrating a hybrid integrated tunable laser according to a particular embodiment of the present invention.

FIG. 1B is a simplified cross-sectional view illustrating a hybrid integrated tunable laser according to a particular embodiment of the present invention. As illustrated in FIG. 1B, direct coupling between the waveguide in the gain media and the waveguide in the silicon layer is utilized. The heater element and the temperature sensor (e.g., an RTD) are illustrated for the phase adjustment section as well as the modulated grating reflector sections. An encapsulant is illustrated over the modulated grating reflector sections. The encapsulant provides for electrical isolation among other features.

Figure 1C:
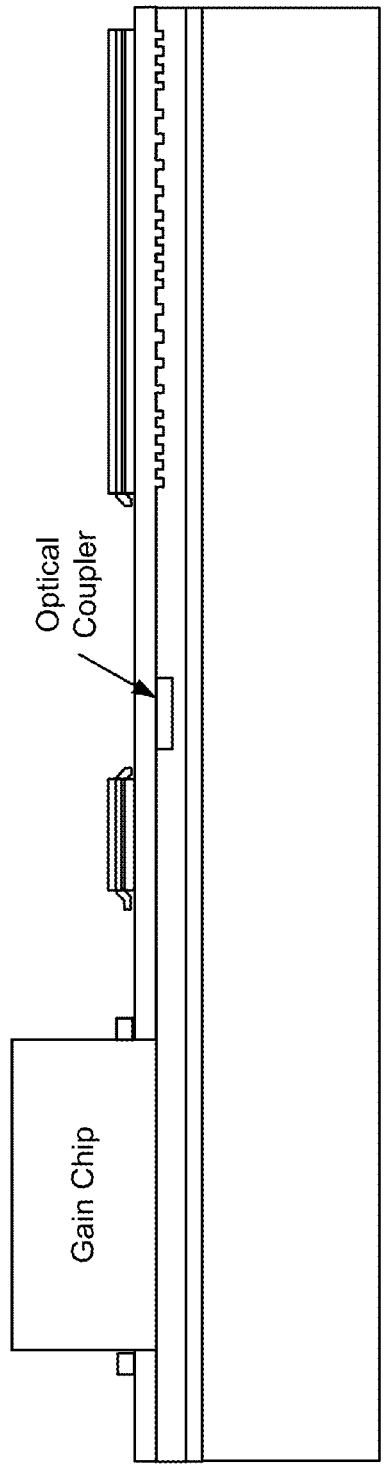
FIG. 1C is a simplified cross-sectional view illustrating a hybrid integrated tunable laser according to a specific embodiment of the present invention.

FIG. 1C is a simplified cross-sectional view illustrating a hybrid integrated tunable laser according to a specific embodiment of the present invention. The structure illustrated in FIG. 1C is similar to that illustrated in FIG. 1B except that evanescent coupling between the waveguide in the gain media and the waveguide in the silicon layer is utilized.

Figure 2A:
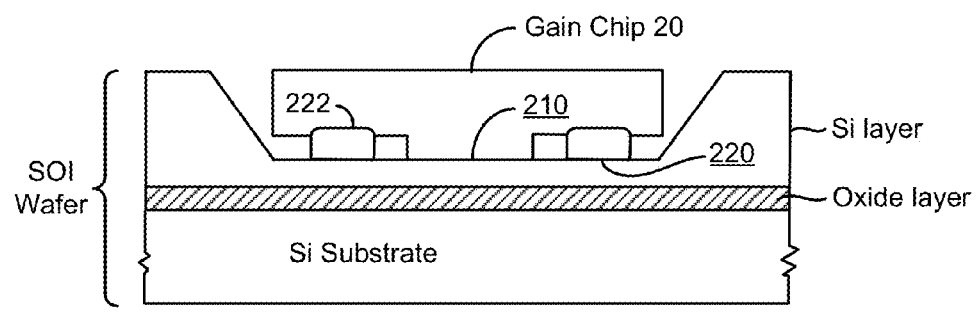
FIG. 2A is a cross-sectional view at cross section A-A' as illustrated in FIG. 1A.
Figure 2B:
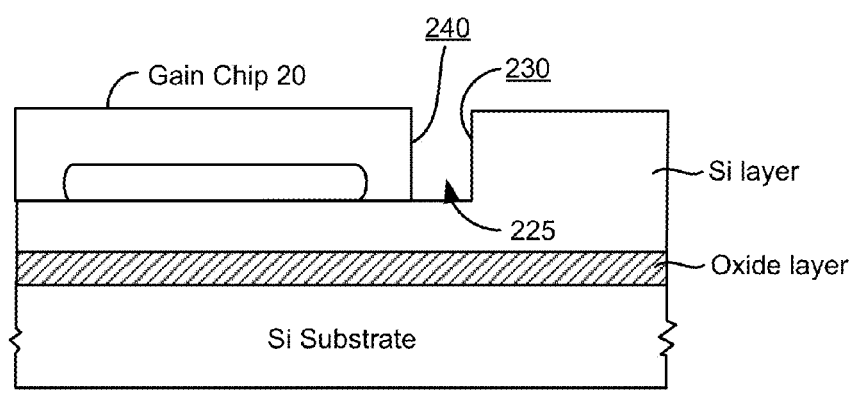
FIG. 2B is a cross-sectional view at cross section B-B' as illustrated in FIG. 1A.

Referring to FIG. 1B, a Controlled Index Layer is illustrated that is not necessarily the same as the index matching layer illustrated in FIG. 2B. The controlled index layer can be used for mode shaping in the silicon waveguide, for example, by using air, $SiO_2$ or the like. According to some embodiments of the present invention, a higher index material is utilized to broaden the mode in the silicon waveguide such that optical coupling to the gain media is improved. If the controlled index layer is not an insulator, an encapsulant layer may also be used between the heater metal and controlled index layer. As illustrated in FIGS. 1B and 1C, either direct coupling (also known as butt coupling) or evanescent coupling of the gain media to the silicon waveguide may be used.

Referring to FIG. 1C, the optical coupler, which may be a device such as a MMI (multimode interference coupler) is illustrated. In some embodiments, an MMI can be formed using an unguided propagation region. Additionally, although not illustrated in FIGS. 1A-1C, a second phase adjust region may be provided in one of the legs of the Y-branched structure in addition to the phase adjustment section illustrated at the output of the tuning section.

FIG. 2A is a cross-sectional view at cross section A-A' as illustrated in FIG. 1A. The silicon substrate 22 is illustrated as well as a silicon-on-insulator (SOI) oxide layer 23 and an SOI silicon layer 24. In the embodiment shown, a portion of the SOI silicon layer has been removed using an etching or other process to provide a recessed region into which the gain chip has been inserted. Such etching may not be performed in the case where evanescent coupling of the light from the gain chip into the silicon waveguide is used. The gain chip is bonded to the silicon substrate in the embodiment illustrated in FIG. 2A using a metal/metal structural bond at locations 25 that provide an electrical bond between the hybrid elements. Additionally, a metal/semiconductor or a semiconductor/semiconductor bond is illustrated. Combinations of these bonding techniques can be implemented as well. One of ordinary skill in the art would recognize many variations, modifications, and alternatives.

FIG. 2B is a cross-sectional view at cross section B-B' as illustrated in FIG. 1A. As will be evident to one of skill in the art, the optical waveguide in the gain chip will be coupled to an optical waveguide in the SOI silicon layer. An index matching region is provided at the interface between the gain chip and the SOI silicon layer to facilitate a high degree of optical coupling between the hybrid devices and to reduce or minimize parasitic reflections. The index matching region can be filled with an appropriate index matching material, remain empty, have optical coatings applied to the surfaces of the hybrid devices as illustrated at facets 26 and/or 27, combinations thereof, or the like.

Referring once again to FIG. 1A first modulated grating reflector 12 provides optical feedback creating a comb of reflected optical wavelengths. Second modulated grating reflector 14 provides optical feedback characterized by a different optical period, thereby resulting in a variable set of reflected wavelengths. The two combs of wavelengths are combined in optical coupler 16. The combs overlap and lasing preferably occurs due to constructive interference. Optionally, where the combs do not overlap, lasing is preferably prevented due to destructive interference. Specific optical spectra of first modulated grating reflector 12 and/or second modulated grating reflector 14 can be modified by varying the refractive index. The refractive index is preferably modified by varying the temperature of the modulated grating reflectors 12, 14 using a heating element. The amount of heating is optionally monitored through use of an RTD element.

Phase adjustment is provided using phase adjustment region 18 to compensate for small phase offsets between the reflection spectra from first modulated grating reflector 12 and the second modulated grating reflector 14. Embodiments of the present invention comprise functional blocks that can be realized in a compound semiconductor such as indium phosphide, and/or silicon and/or similar material. Embodiments of the present invention comprise tuning by modifying the refractive index of the silicon and the like, preferably using a thermal technique.

In embodiments of the present invention, the gain media, which preferably uses a direct-bandgap material, can be realized in a compound semiconductor material. Other embodiments of the present invention include functional blocks that can be realized in silicon material systems. Embodiments of the present invention utilize a hybrid-approach that is preferable for a variety of reasons that include, but are not limited to: manufacturing components using methods that can result in high-yields at low cost; virtually unlimited levels of additional integration can be achieved because of the complexity of the III-V material system as compared to the Si material system, and the like. Therefore, embodiments of the present invention encompass substantially all necessary circuits to control the operation of the tunable laser and can also be monolithically integrated with silicon-based devices.

It should be noted that while embodiments of the present invention have been implemented in relation to products produced by the semiconductor industry, embodiments of the present invention are also useful in optical communications networks for the telecommunications industry, the enterprise communications industry, high-performance computing interconnects, back-plane optical interconnects, chip-to-chip optical interconnects, intra-chip optical interconnects, and the like. In addition to these communication applications, embodiments of the present invention also have applications in the medical device industry.

The following figures illustrate an analysis and applications of waveguides created in silicon using an SOI substrate with a silicon dioxide cap layer. This material system is merely described by way of example and embodiments of the present invention can be implemented in other material systems.

FIG. 3A is a simplified perspective view of a waveguide according to an embodiment of the present invention. As illustrated in FIG. 3A, a waveguide structure is formed with a periodic variation in thickness of one or more layers making up the waveguide. In the illustrated embodiment, the SOI silicon layer varies in thickness with a high portion having thickness H and a low portion having thickness H-h. The width of the waveguide is W. For purposes of clarity, only the top two SOI layers (i.e., the SOI oxide layer and the SOI silicon layer) are illustrated in FIGS. 3A-3C. FIG. 3B is a simplified cross-sectional view at a high index portion of the waveguide illustrated in FIG. 3A according to an embodiment of the present invention. FIG. 3C is a simplified cross-sectional view at a low index portion of the waveguide illustrated in FIG. 3A according to an embodiment of the present invention. It should be noted that the top $SiO_2$ layer shown in these figures may be replaced by another index-controlled layer such as air, $TiO_2$, SiC, ZnS, $Nb_2O_5$, $HfO_2$, $ZrO_2$. As will be evident to one of skill in the art, the indexes of the various materials will impact the shape of the optical modes.

The waveguide structure was analyzed to determine an effective index for the various sections of the waveguide. A vector EM mode solver was used and applied to two different single mode ridge waveguides with two different ridge heights. The effective indices $n_H$ and $n_L$ and mode profiles could be extracted, then the full three-dimensional problem was a one-dimensional problem, with the one-dimensional transfer matrix method efficiently simulating the multi-layer structures. The index difference created reflections that accumulated coherently over the length result in differing reflectances versus wavelength.

Figures 3D, 3E:
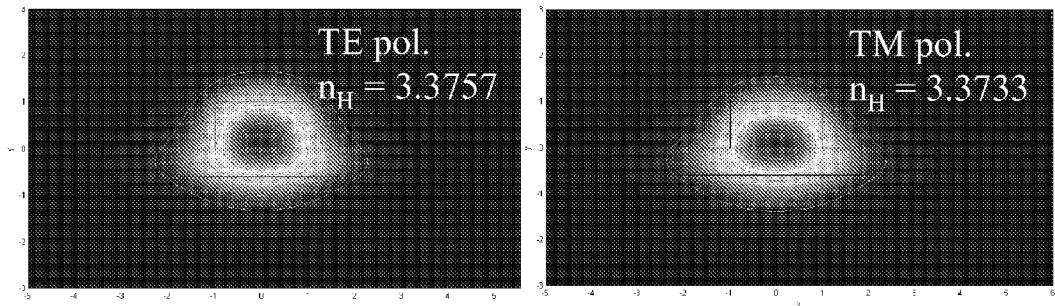
FIG. 3D is a contour plot illustrating a TE mode for the high index portion of the waveguide illustrated in FIG. 3B.
FIG. 3E is a contour plot illustrating a TM mode for the high index portion of the waveguide illustrated in FIG. 3B.
Figures 3F, 3G:
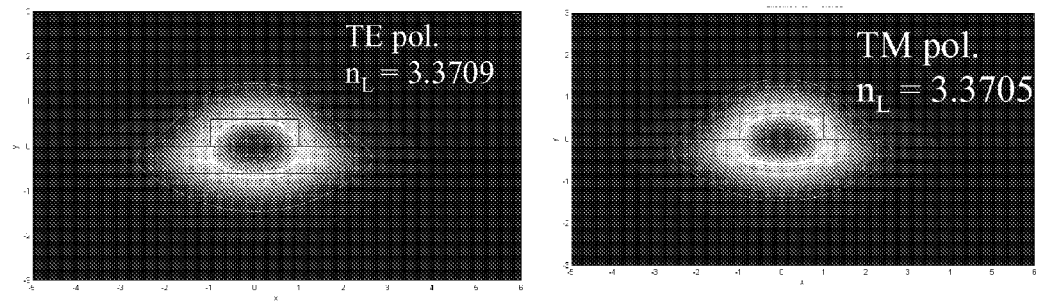
FIG. 3F is a contour plot illustrating a TE mode for the low index portion of the waveguide illustrated in FIG. 3C.
FIG. 3G is a contour plot illustrating a TM mode for the low index portion of the waveguide illustrated in FIG. 3C.

FIG. 3D is a contour plot illustrating a TE mode for the high index portion of the waveguide illustrated in FIG. 3B. FIG. 3E is a contour plot illustrating a TM mode for the high index portion of the waveguide illustrated in FIG. 3B. FIG. 3F is a contour plot illustrating a TE mode for the low index portion of the waveguide illustrated in FIG. 3C. FIG. 3G is a contour plot illustrating a TM mode for the low index portion of the waveguide illustrated in FIG. 3C.

FIG. 4A illustrates a reflectance spectrum for a first modulated grating reflector according to an embodiment of the present invention and FIG. 4B illustrates a reflectance spectrum for a second modulated grating reflector according to an embodiment of the present invention. As illustrated in FIG. 4A, the grating structure includes a superstructure grating (SSG) in which periodically modulated gratings provide a comb-like reflection spectrum. In these gratings, multiple elements of periodicity are provided such that the mode spacing associated with the grating is overlaid with an envelope. The spacing between the modes of the comb will be a function of the height and other features of the grating features formed in the waveguide.

As an example of an SSG, the reflectance spectrum illustrated in FIG. 4A was obtained using the following 3-step modulated superstructure grating parameters:
Duty cycles=[0.5 0.5 0.5]
Periods=[227.7 230 232.3] nm
$N_{sub}$=[110 109 108]
$\Lambda_S$=(25.047+25.07+25.088)=75.205 μm
$n_H$=3.3757; $n_L$=3.3709;
$\Delta n = n_H - n_L = 0.0048$
$N_p$=11
Total number of periods=3597 mixed periods
For these grating parameters, a mode spacing of $\Delta\lambda_1$=4.7 nm was achieved.

As another example of a SSG, the reflectance spectrum illustrated in FIG. 4B was obtained using the following 3-step modulated superstructure grating parameters:
Duty cycles=[0.5 0.5 0.5]
Periods=[228.2 230 231.8] nm
$N_{sub}$=[131 130 129]
$\Lambda_S$=(29.894+29.9+29.902)=89.696 μm
$n_H$=3.3757; $n_L$=3.3709;
$\Delta n = n_H - n_L = 0.0048$
$N_p$=11
Total number of periods=4290 mixed periods
For these grating parameters, a mode spacing of $\Delta\lambda_2$=4.0 nm was achieved.

FIG. 4C illustrates an overlay of the reflectance spectra shown in FIG. 4A and FIG. 4B. FIG. 4D illustrates constructive interference between the reflectance spectra shown in FIG. 4A and FIG. 4B. The first and second modulated grating reflectors are designed to provide different peak spacings such that only a single peak is aligned. Thus, only one cavity mode is selected for lasing. As described below, the single peak can be widely tuned over wavelength space based on thermal effect, free carrier injection, or the like. Although embodiments of the present invention are illustrated in relation to operation and tunability around 1550 nm, other wavelengths are available using appropriate semiconductor laser materials.

Thus, implementations of the silicon hybrid tunable laser of the present invention was capable of tuning over the substantially entire wavelength range of interest. Tuning can be achieved, as described more fully below using several techniques including thermal tuning Referring once again to FIGS. 4A and 4B, the illustrated embodiment is operable over a range of temperatures including 40° C. Tuning of the laser wavelength can be considered as follows: the comb of wavelengths illustrated in FIG. 4A is created by the first modulated grating reflector 12 illustrated in FIG. 1A. The comb of wavelengths illustrated in FIG. 4B is created by the second modulated grating reflector 14 illustrated in FIG. 4B. The overlay of the first comb and the second comb is illustrated in FIG. 4C and demonstrates the combination of the wavelengths obtained from the first modulated grating reflector 12 and the second modulated grating reflector 14. The constructive interference between the two wavelength combs is illustrated in FIG. 4D, with substantially a single peak in the reflectance profile. The one strong reflection peak thus produces the single laser mode, which is the only mode supported by the combined reflectances. In an embodiment, the spectrum illustrated in FIG. 4D will be present as the output of the optical coupler 16 provided to the phase adjustment section 18.

Figure 5A:
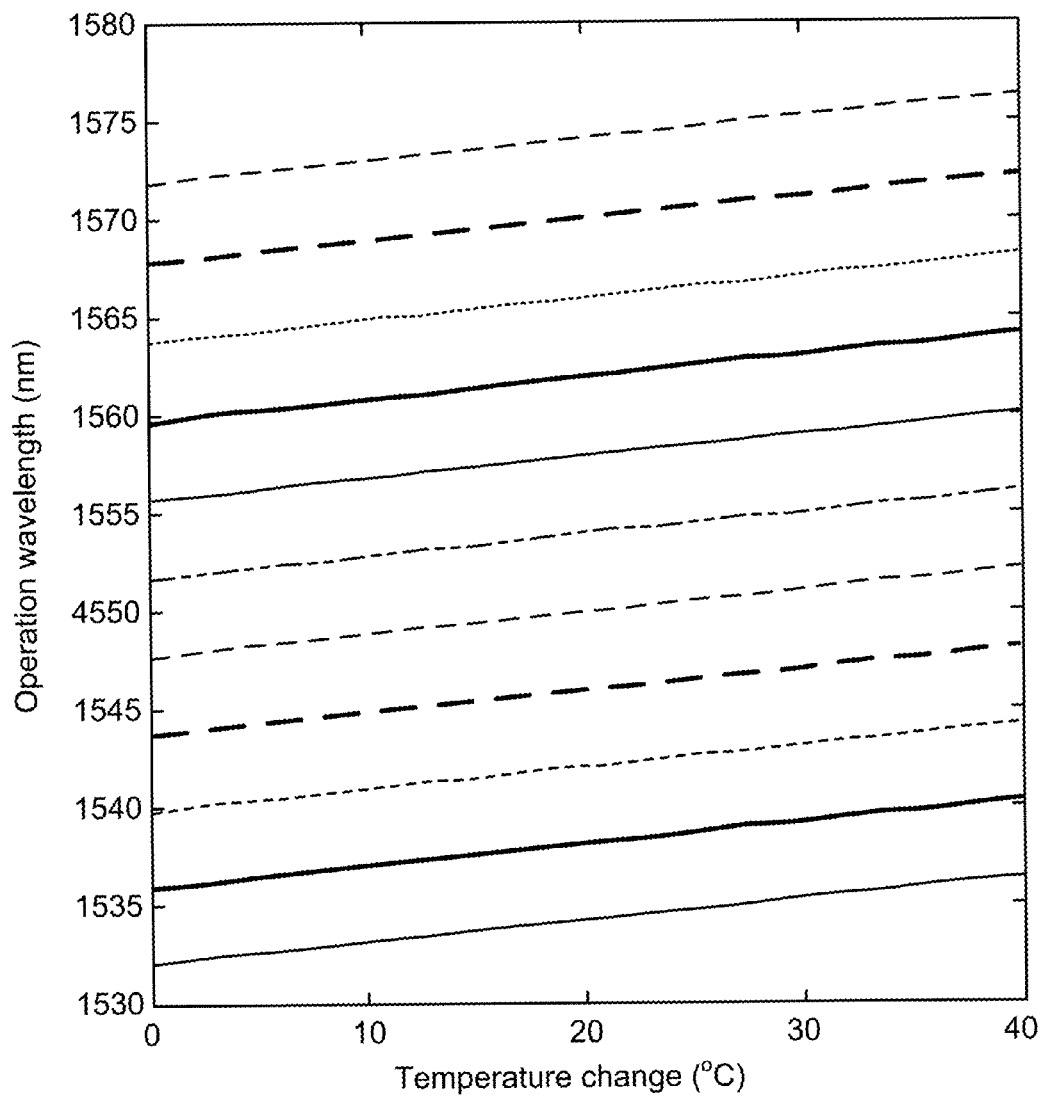
FIG. 5A is a plot illustrating operating wavelength as a function of temperature change according to an embodiment of the present invention.

FIG. 5A is a plot illustrating operating wavelength as a function of temperature change according to an embodiment of the present invention. As illustrated in FIG. 5A, the operating wavelength shifts as a function of temperature in a substantially linear manner. As will be evident to one of skill in the art, the shift in wavelength of the reflection peak as a function of temperature (and index of refraction) results in the shift in operating wavelength.

Figure 5B:
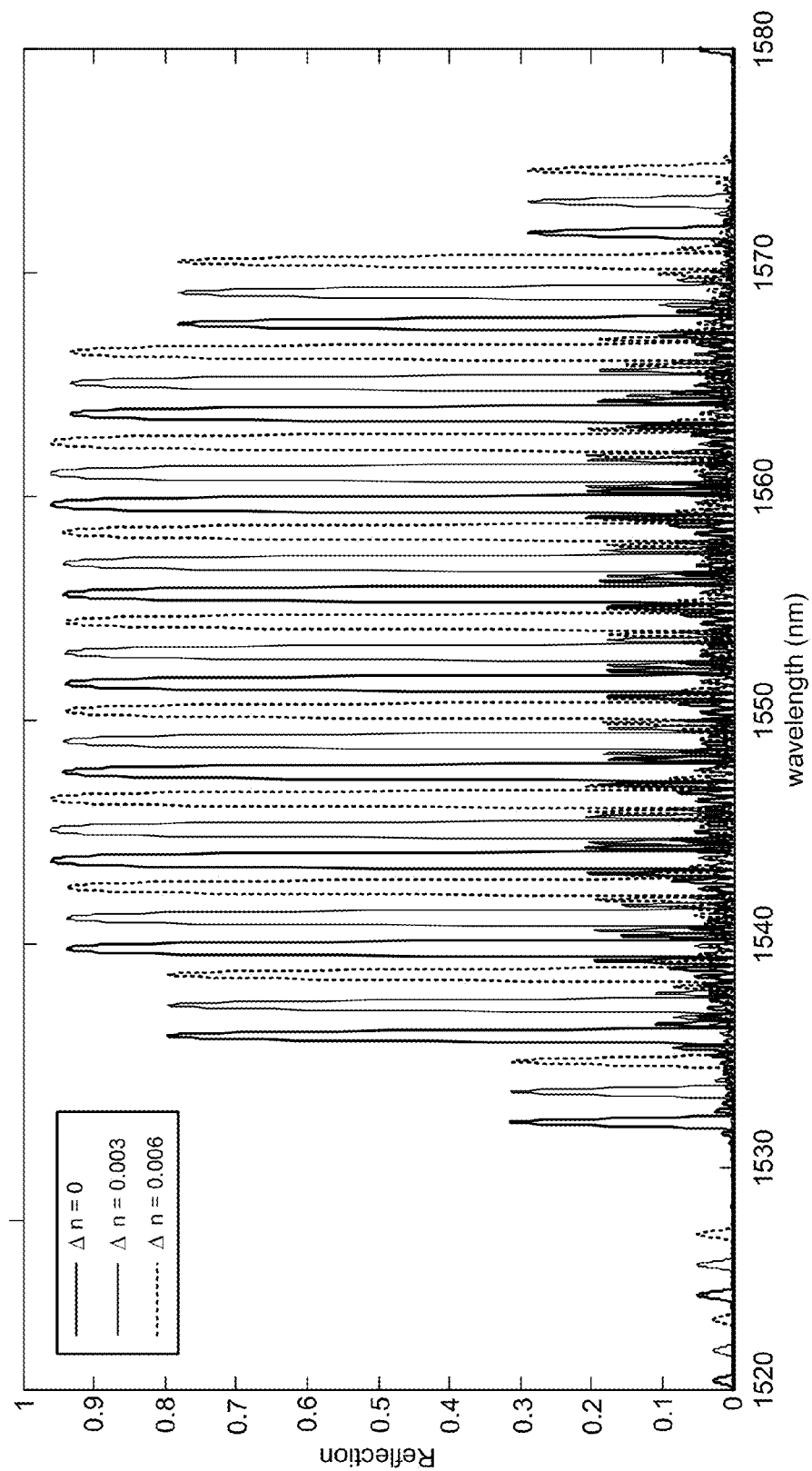
FIG. 5B illustrates wavelength shifting of a reflectance spectrum as a function of index of refraction according to an embodiment of the present invention.

FIG. 5B illustrates wavelength shifting of a reflectance spectrum as a function of index of refraction according to an embodiment of the present invention. For a nominal index ($\Delta n=0$), the peaks of the comb are located at a first set of wavelengths. As the index of refraction is shifted, for example, by thermal tuning, the comb shifts to a new set of wavelengths as illustrated by the combs associated with $\Delta n=0.003$ and $\Delta n=0.006$. Thus, embodiments of the present invention provide for tunability of silicon photonics in which tuning is accomplished using the thermo optic (TO) effect of silicon. The TO coefficient of silicon is approximately $$C_{TO}=2.4\times10^4 K^{-1}$$

over the temperature range up to 650° C. In the embodiments described herein, a conventional silicon ridge waveguide was used for waveguiding so that the TO is considered to be in the same range as the value given above. The index of refraction due to the TO effect can be expressed as:

$$\Delta n = C_{TO}\Delta T.$$

Thus, for a temperate change of about 40° C., a change in the index of refraction of about 0.0096 can be provided for silicon material. As illustrated in FIG. 5B, this translates to a change of about 4 nm in laser wavelength change. It should be noted that the dynamic tuning range for each mode can be adjusted by increasing the number of super-periods ($N_p$).

In addition to thermal tuning, embodiments of the present invention can utilize current tuning based on the Kramer-Kronig relation.

Figure 6:
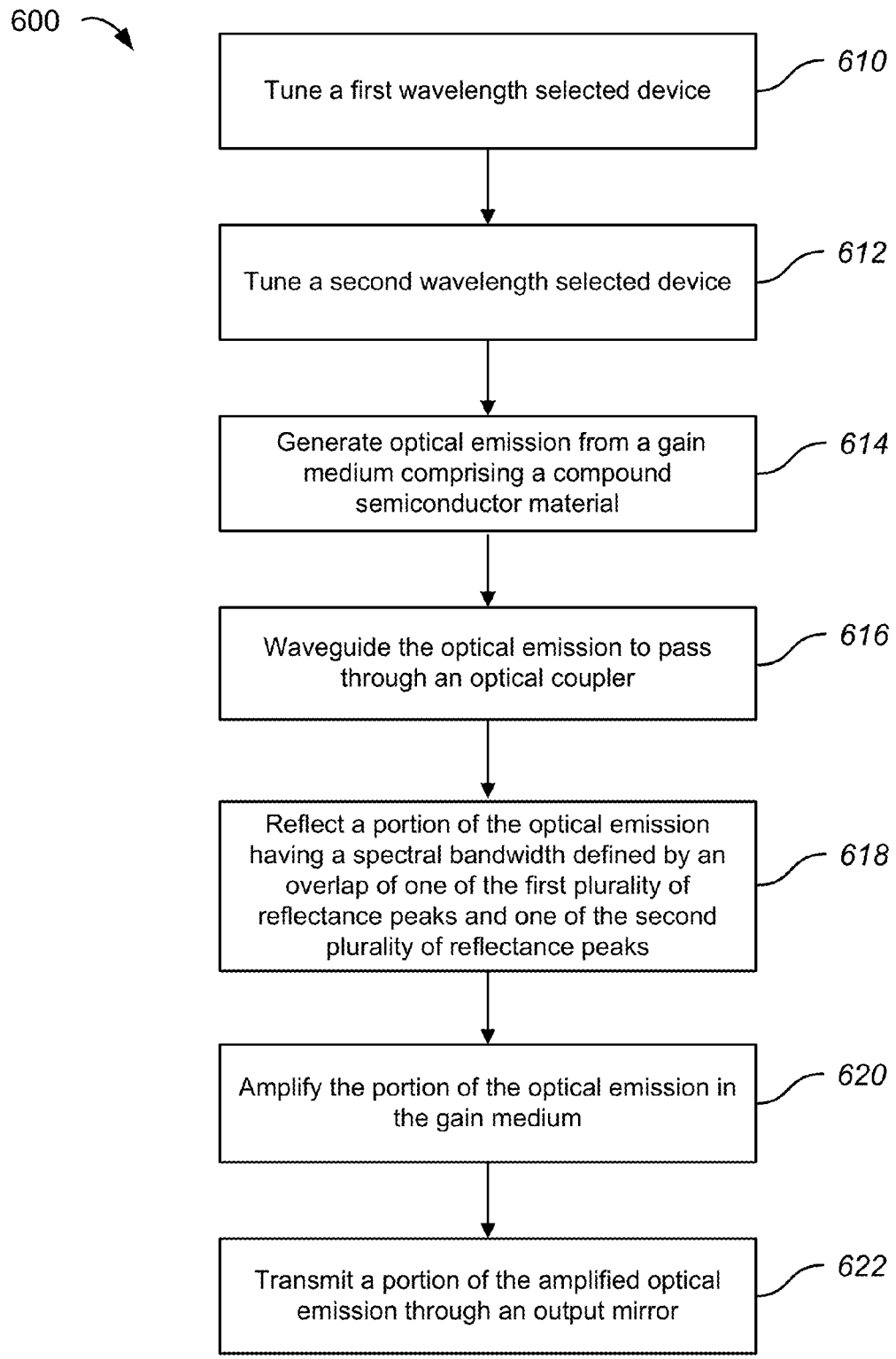
FIG. 6 is a simplified flowchart illustrating a method of operating a hybrid integrated laser according to an embodiment of the present invention.

FIG. 6 is a simplified flowchart illustrating a method of operating a hybrid integrated laser according to an embodiment of the present invention. The method 600, which may be utilized in operating a tunable laser, includes tuning a first wavelength selective device (e.g., a first modulated grating reflector disposed in a silicon layer of an SOI wafer) (610) and tuning a second wavelength selective device (e.g., a second modulated grating reflector disposed in the silicon layer of the SOI wafer) (612). The first wavelength selective device is characterized by a first reflectance spectra including a first plurality of reflectance peaks. The second wavelength selective device is characterized by a second reflectance spectra including a second plurality of reflectance peaks. In a particular embodiment, a first modulated grating reflector includes a superstructure grating characterized by a first wavelength spacing between modes and a second modulated grating reflector includes a superstructure grating characterized by a second wavelength spacing between modes that is different than the first wavelength spacing between modes. The wavelength selective devices can include index of refraction adjustment devices such as thermal devices that enable the tuning functionality that is provided. In applications with thermal devices, temperature sensors such as RTDs can be used to monitor and control thermal inputs. One of ordinary skill in the art would recognize many variations, modifications, and alternatives.

The method also includes generating optical emission from a gain medium comprising a compound semiconductor material (614) and waveguiding the optical emission to pass through an optical coupler (616). The optical emission may pass through a phase adjustment region. The method further includes reflecting a portion of the optical emission having a spectral bandwidth defined by an overlap of one of the first plurality of reflectance peaks and one of the second plurality of reflectance peaks (618), amplifying the portion of the optical emission in the gain medium (620), and transmitting a portion of the amplified optical emission through an output mirror (622).

It should be appreciated that the specific steps illustrated in FIG. 6 provide a particular method of operating a hybrid integrated laser according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple substeps that may be performed in various sequences as appropriate to the individual step. Furthermore, additional steps may be added or removed depending on the particular applications. One of ordinary skill in the art would recognize many variations, modifications, and alternatives.

Figure 7:
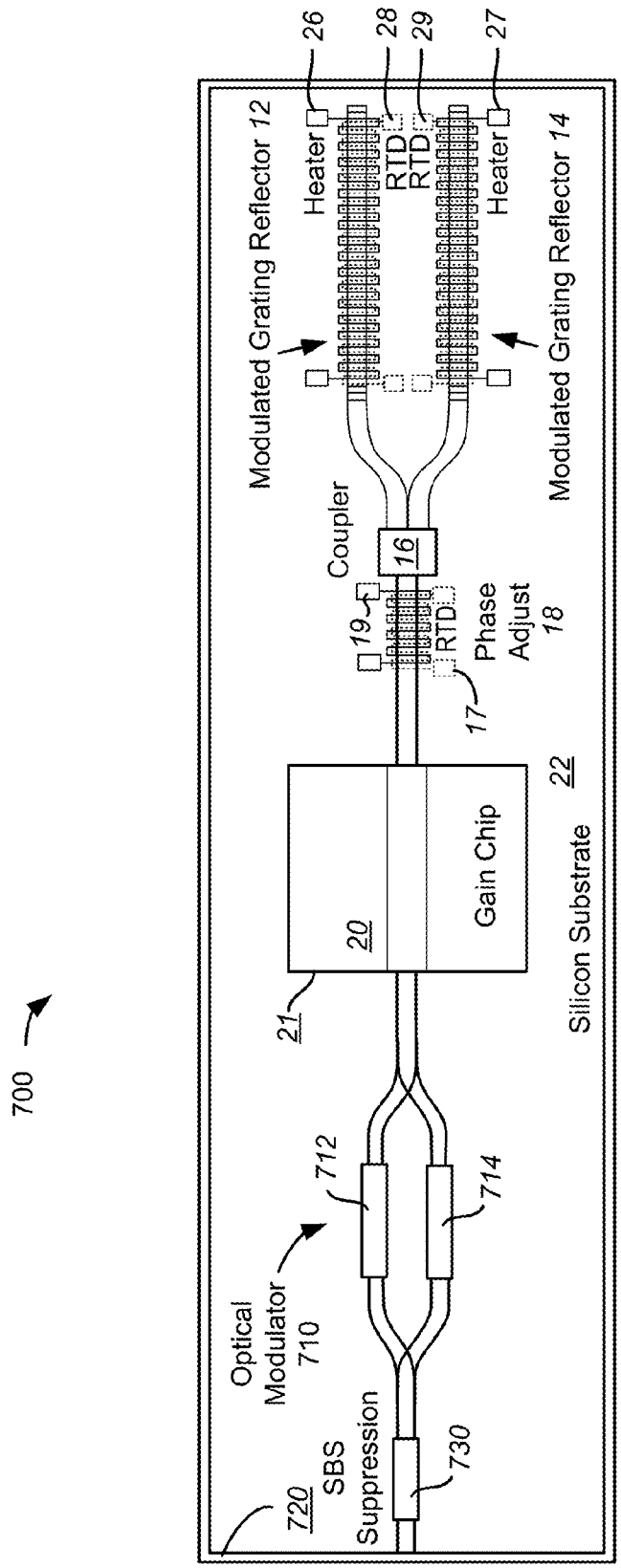
FIG. 7 is a simplified plan view illustrating a hybrid integrated tunable pulsed laser and a phase modulator according to an embodiment of the present invention.

FIG. 7 is a simplified plan view illustrating a hybrid integrated tunable pulsed laser and a phase modulator according to an embodiment of the present invention. The combination of a tunable laser and a modulator provides a tunable pulsed laser system. It will be appreciated that the laser itself is typically operated CW and modulation of the CW laser light by the optical modulator results in intensity variation in the optical output. Thus, although the present specification discusses pulsed laser operation, the overall device can be considered as a pulsed laser, although possibly not in the same way that a laser engineer might think of a "classical" pulsed laser in which lasing action throughout the entire cavity is suppressed. As illustrated in FIG. 7, an optical modulator 710 and a waveguide section 730 for suppression of Stimulated Brillouin Scattering (SBS) are integrated with the hybrid-integrated tunable laser described herein. Modulation of the phase of the pulsed optical signal prior to delivery to an optical fiber (not shown) optically coupled to the output mirror of the device illustrated in FIG. 7 provides suppression of SBS in the optical fiber. In an embodiment, the refractive index of a waveguide section 730 is varied in a predetermined manner to suppress SBS in the optical fiber. Physical mechanisms for creating time-dependent variation in the refractive index using the waveguide section may include, but are not limited to, the thermo-optic effect, electro-optic effect, and free carrier effects.

In some embodiments, the phase of the light is modulated by electrically controlling the refractive index of the optical waveguide section in the SBS suppression section. Through the application of a time-varying signal to the electrical elements controlling refractive index, a time-varying change in the effective optical length in wavelength units of the SBS suppression section is effected. This, as a consequence, results in a time varying phase at the output related to the applied time-varying electrical signal. The electrical signal is designed to broaden the line-width of the optical source such that it is greater than the Brillouin linewidth, which might typically be about 20 MHz. Although a single optical modulator 710 and a single waveguide section 730 are illustrated in FIG. 7, one or more optical modulators and/or one or more waveguide sections useful as phase modulators can be utilized according to embodiments of the present invention. Thus, embodiments of the present invention are suitable for use with advanced modulation formats.

After light passes through the gain chip 20, it is split into the two legs 712 and 714 of the illustrated modulator, where the light in one leg can be phase shifted with respect to the light in the other leg, enabling modulation of the light to be implemented. Elements to apply the phase shift to the light in one leg with respect to the other leg, such as electrodes, conductors, and the like, are not illustrated for the purpose of clarity.

The optical modulator 710 illustrated in FIG. 7 is a Mach Zehnder modulator, but other optical modulators utilizing other modulation methods, for example, amplitude modulation using absorption effects (e.g., the quantum-confined Stark effect) may be utilized according to alternative embodiments of the present invention. Therefore, although a Mach Zehnder modulator is illustrated in FIG. 7, embodiments of the present invention are not limited to this particular implementation.

Utilizing the fabrication methods described herein, the optical modulator 710 and the waveguide section 730 may be directly integrated into the silicon. In other embodiments, materials other than silicon are used in implementing the modulator and/or the waveguide section and can be fabricated using composite bonding methods. Examples of other materials suitable for inclusion in the modulator include ternary or quaternary materials lattice-matched to InP or GaAs, non-linear optical materials such as lithium niobate, or the like.

In the embodiment illustrated in FIG. 7, the optical modulator and the waveguide section can modulate the output produced from output mirror 21 formed on the gain chip (i.e., an external modulation technique) or can be operated as intracavity modulators (i.e., the optical modulator and the waveguide section are intracavity optical elements), with an output mirror provided at surface 720. Thus, both external modulation and internal modulation techniques are included within the scope of the present invention. The output produced by the tunable laser with SBS suppression is characterized by a tunable wavelength and pulse characteristics associated with the optical modulator and the waveguide section.

In one implementation, the output mirror 21 is formed by the facet of the gain chip, so that the output is upstream of the optical modulator 710. In other embodiments, the output mirror is positioned between the optical modulator 710 and the waveguide section 730.

Thus, in an embodiment of the present invention, an optical phase modulator is included to provide suppression of SBS in the optical media coupled to the device. In another embodiment of the present invention, electronics are provided to drive and control all or a subset of the optical devices with electrical input or output signals. In other embodiments, further optical devices with or without their associated electronics, such as monitor photodiodes for various sections of the optical path, are included on the silicon photonic chip.

It should be noted that embodiments of the present invention provide for combinations of amplitude modulation, phase modulation, and polarization multiplexing techniques. As will be evident to one of skill in the art, advanced modulation techniques encode information in both amplitude and phase and RF signals can be sent directly on optical carriers without conversion to the digital domain. Thus, embodiments of the present invention provide methods and systems suitable for such advanced modulation techniques.

Figure 8:
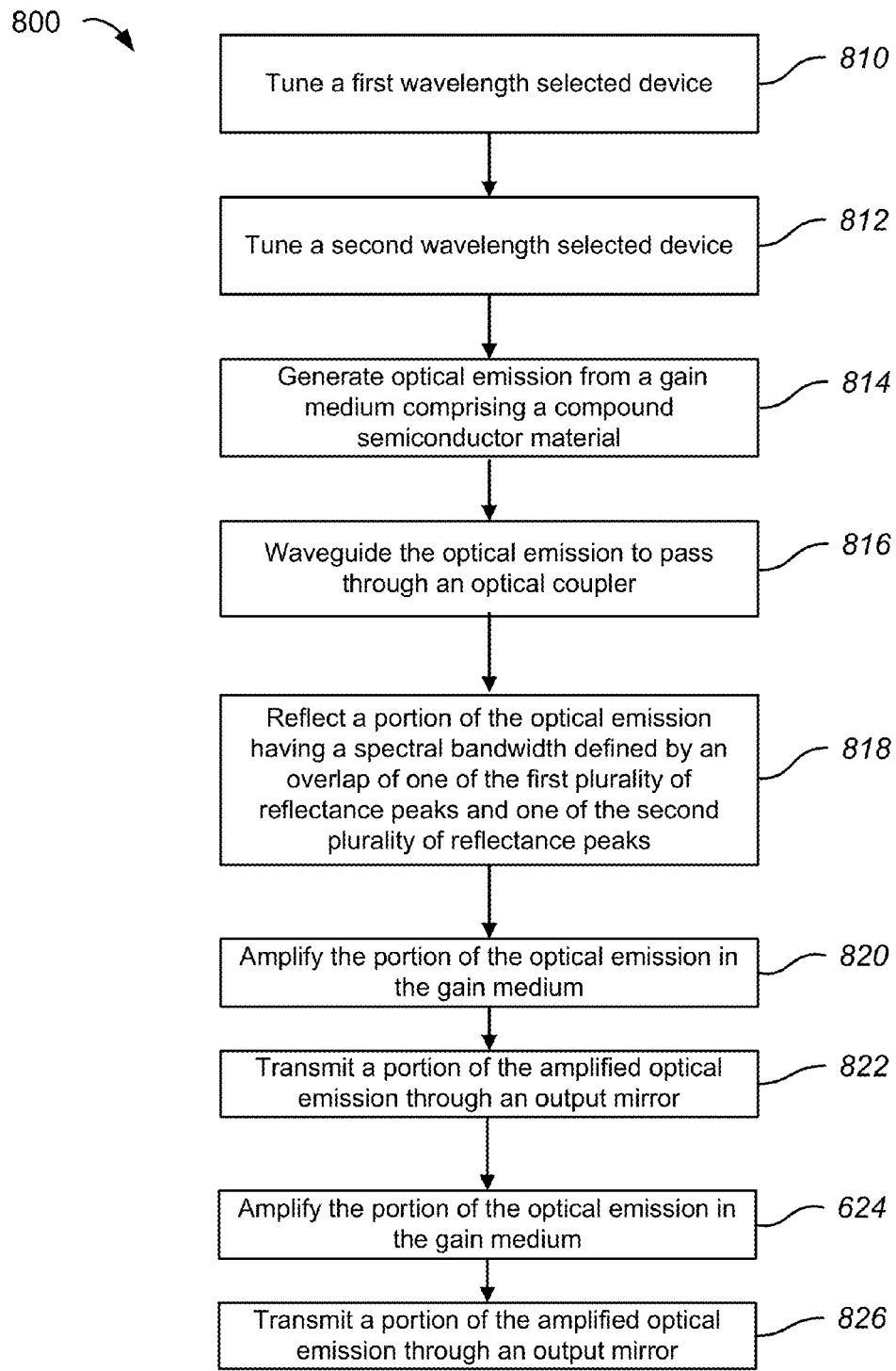
FIG. 8 is a simplified flowchart illustrating a method of operating a tunable pulsed laser according to an embodiment of the present invention.

FIG. 8 is a simplified flowchart illustrating a method of operating a tunable pulsed laser according to an embodiment of the present invention. The method includes tuning a first modulated grating reflector (810) and tuning a second modulated grating reflector (812). The first modulated grating reflector is characterized by a first reflectance spectra including a first plurality of reflectance peaks and the second modulated grating reflector is characterized by a second reflectance spectra including a second plurality of reflectance peaks. The method also includes generating optical emission from a gain medium comprising a compound semiconductor material (814), waveguiding the optical emission to pass through an optical coupler (816), and reflecting a portion of the optical emission having a spectral bandwidth defined by an overlap of one of the first plurality of reflectance peaks and one of the second plurality of reflectance peaks (818). The method further includes amplifying the portion of the optical emission in the gain medium (820), transmitting a portion of the amplified optical emission through an output mirror (822), optically modulating the transmitted optical emission to form a pulsed optical output (824), and phase modulating the pulsed optical output (826). Phase modulation can provide a time varying phase profile for the output.

In an embodiment, the first modulated grating reflector and the second modulated grating reflector are disposed in a silicon on insulator wafer. As an example, the silicon on insulator wafer can include a silicon substrate, an oxide layer disposed on the silicon substrate, and a silicon layer disposed on the oxide layer. The first modulated grating reflector and the second modulated grating reflector can be disposed in the silicon layer. In some embodiments, the phase adjustment is provided.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A tunable pulsed laser comprising:
   a substrate comprising a silicon material and a recess region having an interface;
   a gain medium coupled to the substrate and having a facet spatially separated from the interface by an index matching region, wherein the gain medium includes a compound semiconductor material;
   an optical modulator optically coupled to the gain medium;
   a phase modulator optically coupled to the optical modulator;
   a waveguide disposed in the substrate and optically coupled to the gain medium;

a first wavelength selective element characterized by a first reflectance spectrum and disposed in the substrate;
a second wavelength selective element characterized by a second reflectance spectrum and disposed in the substrate;
an optical coupler disposed in the substrate and joining the first wavelength selective element, the second wavelength selective element, and a phase adjustment section disposed in the silicon material substrate between the waveguide and the optical coupler, the phase adjustment section having a heating element; and
an output mirror.

2. The tunable pulsed laser of claim 1 wherein:
the first wavelength selective element comprises a first modulated grating reflector; and
the second wavelength selective element comprises a second modulated grating reflector.

3. The tunable pulsed laser of claim 2 wherein the first modulated grating reflector comprises a superstructure grating characterized by a first wavelength spacing between modes.

4. The tunable pulsed laser of claim 3 wherein the second modulated grating reflector comprises a superstructure grating characterized by a second wavelength spacing between modes different than the first wavelength spacing between modes.

5. The tunable pulsed laser of claim 1 wherein the silicon material comprises a silicon on insulator wafer.

6. The tunable pulsed laser of claim 5 wherein the silicon on insulator wafer comprises a silicon substrate, an oxide layer disposed on the silicon substrate, and a silicon layer disposed on the oxide layer, wherein the first wavelength selective element and the second wavelength selective element are disposed in the silicon layer.

7. The tunable pulsed laser of claim 1 wherein the optical modulator and the phase modulator comprise external cavity optical elements.

8. The tunable pulsed laser of claim 1 wherein:
the first wavelength selective element comprises a first index of refraction adjustment device; and
the second wavelength selective element comprises a second index of refraction adjustment device.

9. The tunable pulsed laser of claim 8 wherein:
the first index of refraction adjustment device comprises a thermal device; and
the second index of refraction adjustment device comprises a thermal device.

10. The tunable pulsed laser of claim 9 further comprising:
a controlled index layer over the waveguide having a higher refractive index than the silicon material waveguide, the controlled index layer broadening a mode in the waveguide; and
an encapsulant layer disposed between a metal of at least one of the thermal devices and the controlled index layer.

11. The tunable pulsed laser of claim 10 wherein a portion of the controlled index layer is disposed within the index matching region to form an index matching layer within the index matching region.

12. The tunable pulsed laser of claim 8 wherein
the first wavelength selective element further comprises a first temperature sensor; and
the second wavelength selective element further comprises a second temperature sensor.

13. The tunable pulsed laser of claim 1 wherein the optical modulator comprises a Mach-Zehnder modulator.

14. The tunable pulsed laser of claim 1 further comprising a second phase adjustment section operable to modify an optical phase in at least one of the first wavelength selective element or the second wavelength selective element.

15. The tunable pulsed laser of claim 1 further comprising a controlled index layer over the waveguide having a higher refractive index than the silicon material waveguide, the controlled index layer broadening a mode in the waveguide.

16. The tunable pulsed laser of claim 1 further comprising an encapsulant layer disposed over the first and second wavelength selective elements.

17. A method of operating a tunable pulsed laser, the method comprising:
tuning, using a first resistive thermal device, a first modulated grating reflector, wherein the first modulated grating reflector is characterized by a first reflectance spectra including a first plurality of reflectance peaks;
tuning, using a second resistive thermal device, a second modulated grating reflector, wherein the second modulated grating reflector is characterized by a second reflectance spectra including a second plurality of reflectance peaks;
generating optical emission from a gain medium comprising a compound semiconductor material;
adjusting a phase of the optical emission from the gain medium through a phase adjustment section integrated in a silicon layer using a heating element;
waveguiding the phase adjusted optical emission to pass through an optical waveguide in the silicon layer to an optical coupler;
reflecting a portion of the optical emission having a spectral bandwidth defined by an overlap of one of the first plurality of reflectance peaks and one of the second plurality of reflectance peaks;
transmitting the portion of the optical emission through an index matching region disposed between the optical waveguide in the silicon layer and the gain medium;
amplifying the portion of the optical emission in the gain medium;
transmitting a portion of the amplified optical emission through an output mirror;
optically modulating the transmitted optical emission to form a pulsed optical output; and
phase modulating the pulsed optical output.

18. The method of claim 17 wherein the first modulated grating reflector and the second modulated grating reflector are disposed in a silicon on insulator wafer.

19. The method of claim 18 wherein the silicon on insulator wafer comprises a silicon substrate, an oxide layer disposed on the silicon substrate, and a silicon layer disposed on the oxide layer, wherein the first modulated grating reflector and the second modulated grating reflector are disposed in the silicon layer.

20. The method of claim 18 wherein phase modulating the pulsed optical output comprises producing a time varying phase profile.

21. The method of claim 17 wherein the first modulated grating reflector comprises a superstructure grating characterized by a first wavelength spacing between modes.

22. The method of claim 21 wherein the second modulated grating reflector comprises a superstructure grating characterized by a second wavelength spacing between modes different than the first wavelength spacing between modes.

23. The method of claim 17 wherein:
the first and second modulated grating reflectors are integrated into the silicon layer; and
the first and second resistive thermal devices have been integrated onto the silicon layer by vacuum deposition.

* * * * *